(12) United States Patent
Magnee et al.

(10) Patent No.: US 7,883,954 B2
(45) Date of Patent: Feb. 8, 2011

(54) SELF-ALIGNED EPITAXIALLY GROWN BIPOLAR TRANSISTOR

(75) Inventors: Peter Magnee, Malden (NL); Wibo Van Noort, Westbrook, ME (US); Johannes Donkers, Valkenswaard (NL)

(73) Assignee: NXP B.V., Eindhoven (NL)

( * ) Notice: Subject to any disclaimer, the term of this patent is extended or adjusted under 35 U.S.C. 154(b) by 353 days.

(21) Appl. No.: 11/574,013

(22) PCT Filed: Aug. 19, 2005

(86) PCT No.: PCT/IB2005/052741

§ 371 (c)(1),
(2), (4) Date: Apr. 8, 2009

(87) PCT Pub. No.: WO2006/018821

PCT Pub. Date: Feb. 23, 2006

(65) Prior Publication Data

US 2009/0203184 A1    Aug. 13, 2009

Related U.S. Application Data

(60) Provisional application No. 60/603,430, filed on Aug. 20, 2004.

(51) Int. Cl.
*H01L 21/8238* (2006.01)
(52) U.S. Cl. .................. 438/202; 438/312; 438/341; 438/360; 438/363; 257/E21.696

(58) Field of Classification Search .................. 438/203, 438/322, 363, 365, 312, 341, 357, 360, 202; 257/E21.387, E21.695, E21.696, E21.371, 257/E21.395
See application file for complete search history.

(56) References Cited

U.S. PATENT DOCUMENTS

| 5,227,654 | A   | * | 7/1993 | Momose et al. ............. 257/370 |
| 6,846,710 | B2  | * | 1/2005 | Yi et al. ....................... 438/202 |
| 2005/0079678 | A1 | * | 4/2005 | Verma et al. ................ 438/312 |

* cited by examiner

*Primary Examiner*—Julio J Maldonado (57) ABSTRACT

The illumination system has a light source (1) with a plurality of light emitters (R, G, B). The light emitters comprise at least a first light-emitting diode of a first primary color and at least a second light-emitting diode of a second primary color, the first and the second primary colors being distinct from each other. The illumination system has a facetted light-collimator (2) for collimating light emitted by the light emitters. The facetted lightcollimator is arranged along a longitudinal axis (25) of the illumination system. Light propagation in the facetted light-collimator is based on total internal reflection or on reflection at a reflective coating provided on the facets of the facetted light-collimator. The facetted light-collimator merges into a facetted light-reflector (3) at a side facing away from the light source. The illumination system further comprises a light-shaping diffuser (17). The illumination system emits light with a uniform spatial and spatio-angular color distribution.

9 Claims, 8 Drawing Sheets

SELF-ALIGNED EPITAXIALLY GROWN BIPOLAR TRANSISTOR

CROSS REFERENCE TO RELATED APPLICATION

This application claims the benefit of U.S. provisional application Ser. No. 60/603,430 filed Aug. 20, 2004, which is incorporated herein whole by reference.

FIELD OF INVENTION

This invention relates the processing semiconductors. More particularly, this invention relates to the fabrication of a self-aligned bipolar transistor that is compatible with CMOS processing.

BACKGROUND

The electronics industry continues to rely upon advances in semiconductor technology to realized higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

Many varieties of semiconductor devices are manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, and CMOS combined with bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions. In bipolar transistors, an active device generally includes emitter and collector regions and a base electrode to control operation of the transistor.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

In some processes, both CMOS and bipolar transistors are fabricated on the same device so that the advantages of each technology may be realized. For example, integrated circuits used in wireless communication may use CMOS logic to control particular user-operations while the bipolar technology provides necessary RF components.

The following references provide background information on bipolar processing that may be integrated with a CMOS fabrication process; they are incorporated by reference in their entirety.

U.S. Pat. No. 5,340,753 (issued Aug. 23, 1994) titled, "Method for Fabricating Self-Aligned Epitaxial Base Transistor" of Bassous et al., relates to the fabrication of very small integrated bipolar transistors using double polysilicon deposition technology and more particularly, to self-aligned epitaxial base transistors formed by low temperature epitaxy.

U.S. Pat. No. 6,228,733 B1 (issued May 8, 2001) titled, "Non-Selective Epitaxial Deposition Technology" of Lee et al., relates to the general field of bipolar transistor manufacture with particular reference to the base layer.

U.S. Patent Application Publication US 2002/0132438 A1 (published Sep. 19, 2002) titled, "Epitaxial Base Bipolar Transistor with Raised Extrinsic Base" of Dunn et al., relates to bipolar transistors, and more particularly to an epitaxial base bipolar transistor having a raised extrinsic base and method of fabricating same.

RF performance of bipolar transistors is largely limited by parasitics. In combining bipolar and CMOS on a single substrate one has to minimize the parasitic capacitance between the collector and base ($C_{CB}$) and emitter and base ($C_{EB}$). Furthermore, there may be increased base resistance ($R_{B-ext}$). Such parasitics negatively affect device performance.

There exists a continuous need to minimize the parasitic collector-base ($C_{CB}$) and emitter-base ($C_{EB}$) capacitance of a bipolar transistor and to minimize the base resistance $R_{B-ext}$. Furthermore, the process should be compatible with CMOS recipes and not require too many additional steps.

SUMMARY OF INVENTION

The present invention has been found useful in fabricating a bipolar transistor, or a SiGe hetero-junction bipolar transistor (HBT), in a fully self-aligned manner and is compatible with CMOS processing. Hence, the invention may be suitable for BiCMOS integration. The fully-self aligned manner in which the bipolar transistor is formed means that the emitter-definition and the extrinsic base connection are both aligned to the bipolar active area. The fabrication of the bipolar transistor entails reducing the size of the active area required to build the bipolar transistor.

The present invention provides for a small overlay between extrinsic base and collector, and between emitter and extrinsic base minimize the excess (parasitic) collector-base ($C_{CB}$) and emitter-base ($C_{EB}$) capacitance respectively. Also it provides a short extrinsic base-link and the optional extra doping in the base-link reduces the extrinsic base resistance $R_B$-ext. Furthermore, the present invention may be embedded into a CMOS process flow in that only two additional masks are needed to fabricate the HBT and these masks are not alignment-sensitive.

In an example embodiment according to the present invention, there is a method for forming a self-aligned bipolar transistor over a silicon substrate having a well region of a first polarity type. The method comprises defining a bipolar active region and field region in the bipolar region using a first bipolar mask. The active transistor area has an isolation region separating a bipolar region and a CMOS region. Defining the bipolar active area includes etching the bipolar active region to a predetermined depth, depositing a silicon-germanium-type (SiGe-type) base layer of a second polarity type into the bipolar active region and the field area. Within the bipolar active region, inside spacers on the SiGe-type base layer are formed. An emitter region is formed between the inside spacers in the bipolar active region. Forming an emitter region includes, filling the emitter region with doped silicon of a first polarity type. An extrinsic base region is defined using a second bipolar mask, removing material in the SiGe-type base layer as a function of masking protection provided by the second bipolar mask. A collector region within the CMOS region is implanted. At least one contact area for each of the extrinsic base region, the emitter region, and the collector region of the active transistor areas is defined.

In another example embodiment according to the present invention, on a silicon substrate having a well region of a first polarity type, the well region apportioned into active transistor areas, the active transistor area having a bipolar region and a CMOS region, there is a method for forming a self-aligned bipolar transistor. The method comprises defining a bipolar active region and field region in the bipolar region with a first bipolar mask. Defining the bipolar active area includes, etching the bipolar active region to a first predetermined depth, forming spacers in the bipolar active region, depositing a silicon-germanium (SiGe-type) base layer of a second polarity type into the bipolar active region and the field area, and forming a U-cup spacer on the SiGe-type base layer within the bipolar active region. Forming the U-cup spacer includes, depositing a thin nitride layer on the SiGe-type base layer, depositing a thick oxide on top of the thin nitride layer, planarizing the thick oxide layer, stopping on the thin nitride layer, removing the nitride layer from the SiGe-type base layer, and increasing the depth of the bipolar active region to a second predetermined depth. An emitter region is formed between the inside spacers in the bipolar active region; defining the emitter region includes, filling the emitter region with doped silicon of a first polarity type. An extrinsic base region is defined with a second bipolar mask, removing SiGe base layer from those areas not protected by the second bipolar mask. A collector region with the CMOS region is implanted. At least one contact area is defined for each of the extrinsic base region, the emitter region, and the collector region of the active transistor areas.

The above summaries of the present invention are not intended to represent each disclosed embodiment, or every aspect, of the present invention. Other aspects and example embodiments are provided in the figures and the detailed description that follow.

BRIEF DESCRIPTIONS OF THE DRAWINGS

The invention may be more completely understood in consideration of the following detailed description of various embodiments of the invention in connection with the accompanying drawings, in which:

FIGS. 5A-11A depict a series of cross-sections in the building of a self-aligned bipolar transistor on the prepared wafer substrate according to an embodiment of the present invention;

FIGS. 5B-11B depict a series of cross-sections in the building of a self-aligned bipolar transistor on the prepared wafer substrate according to another embodiment of the present invention;

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims

DETAILED DESCRIPTION

The present invention has been found useful in the fabrication of a bipolar transistor, or a SiGe hetero-junction bipolar transistor (HBT), in a fully self-aligned manner, which is compatible with standard CMOS processing. Hence, this structure is suitable for BiCMOS integration. When embedded in a CMOS process, the present invention may be implemented with two additional masks. The invention uses the topography in the active area to define the emitter and extrinsic base. Necessary topography is defined with a selective etch, lowering the bipolar active area 110 (between the STI regions) while protecting the CMOS regions.

Figure 1:
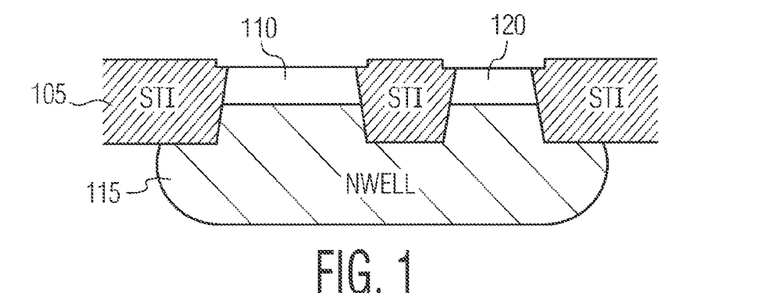
FIGS. 1-4 depict a series of cross-section in preparation of a wafer substrate for the building a self-aligned bipolar transistor according to the present invention.

Refer to FIGS. 1-4. The building of the bipolar transistor according to the present invention is begun before the gate-oxide and gate poly-silicon are deposited and patterned. Two purposes are served. The patterned gate-stack would give rise to too much topography. The thermal budget of the bipolar processing, especially during the pre-bake step in the applying of epitaxial layers, will then not have significant impact on the shallow source/drain junctions of the CMOS transistors. Refer to FIG. 1. A substrate has shallow trench (STI) regions 105 and an N-well 115. Areas are reserved for the active region 110 of a bipolar and an active region 120 for a CMOS transistor. The N-well 115 can be used to establish electrical connection to the collector of the bipolar transistor. Although the discussion presented is for an N-type transistor structure, the invention may be applied to a P-type transistor structure as well.

Figure 2:
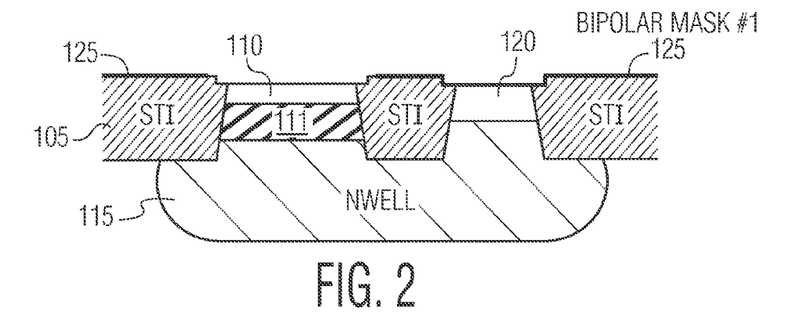
Figure 3:
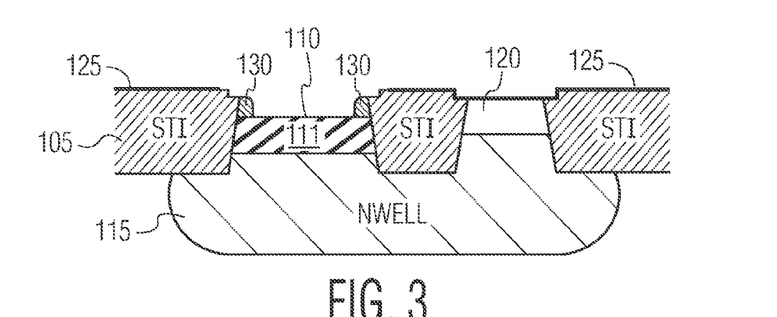

Refer to FIG. 2. The CMOS active region 120 is covered with a protection layer. This protection layer may be an oxide/nitride stack. The bipolar active area is opened, using a dedicated mask 125. The mask 125 (which is the first additional mask of the process) may be used to perform a selective collector implantation 111. Refer to FIG. 3. In an example process, a hydrogen chloride (HCl) etch in-situ in the epitaxial growth chamber, the height of the bipolar active region 110 can be lowered. The etch leaves steep vertical edges along the oxide of the STI 105. Mask 125 is in place protecting the CMOS active region 120. To enhance the base-link (extrinsic to intrinsic base connection), a spacer 130 having boron-doped glass (BSG) in one example process, or B-dope poly-silicon, in another example process may be formed along-side the edges of the STI 105. To prevent the doping of the collector regions with boron, this BSG or B-IDP spacer 130 may be separated from the collector by a thin oxide/nitride layer.

In another example process, it may be useful in leaving out the BSG spacers so that an HCl-etch and an SiGe epitaxy step may done in a single step within the same epi-tool.

The SiGe layer can be deposited with various techniques: CVD (chemical vapor deposition) at reduced pressure (20 Torr), UHV-CVD (ultra-high vacuum chemical vapor deposition), or MBE (molecular beam epitaxy). The deposition conditions are chosen such that the crystallinity of the growing layer aligns to the exposed underlying crystal (the silicon wafer), this is epitaxial growth. Random poly-crystalline or amorphous growth will occur on areas where no seed crystal is present (oxide or nitride for example). This is called "differential growth". The first technique (reduced-pressure CVD) is most commonly used in industry because it is optimal in terms of versatility, equipment maintenance (downtime), and material quality. MBE is rarely used industrially.

CVD epitaxy is performed by passing a mixture of gasses such as $SiH_4$, or $SiCl_2H_2$, $GeH_4$ and various dopant species such as $B_2H_6$, $PH_3$, $AsH_3$ mixed with purified hydrogen carrier gas over the wafer. The CVD is performed at a specific temperature (between 400° C. to 700° C. for SiGe layers, Si epitaxy can be performed up to 1150° C.). In most advanced processes also small fractions of carbon are added. The gas mixture, temperature, pressure, etc. can be altered during the deposition process such that a stack of material is obtained with varying composition, doping concentrations, etc.

Typical dopant concentrations can vary from about $1\times10^{15}$ cm$^{-3}$ to about $1\times10^{20}$ cm$^{-3}$. In an example process, a concentration of about $2\times10^{18}$ cm$^{-3}$ to about $1\times10^{19}$ cm$^{-3}$ may be used. Boron or other suitable species may be used. Ge concentrations can vary from about 0% to about 30% to about 40% (about 20% to about 25% is typical). Carbon concentrations are on the order of tenths of a percent. Satisfactory transistor performance requires a delicate optimization process of the epi-stack and its effect on other stages of the process. The resulting stack is a silicon-like (diamond) lattice with the occasional Ge, C or dopant atom on a substitutional site.

Figure 4:
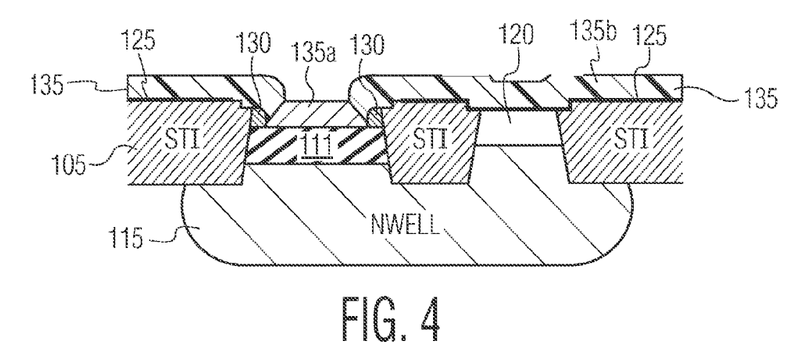

Refer to FIG. 4. Having formed the BSG spacers 130, a SiGe layer is deposited using non-selective (differential) epitaxial growth (DEG), forming mono-crystalline epitaxial silicon(epi) 135a in the bipolar active region 110, and polycrystalline silicon 135b on the filed. The BSG spacers 130 help to dope the grain-boundary in the corner of p-type material during subsequent thermal process steps.

Figure 5A:
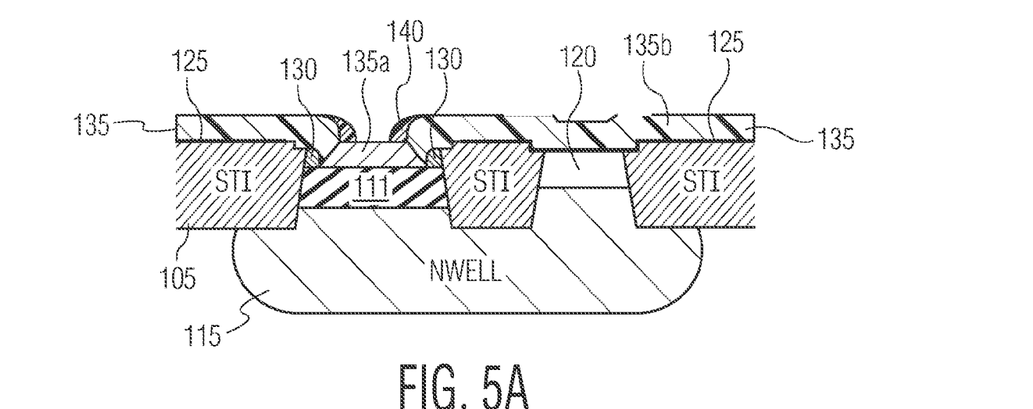

Refer to FIGS. 5A-11A. In an example embodiment according to the present invention. Upon the substrate having gone through process steps as illustrated in FIGS. 1-4. Refer to FIG. 5A. Inside spacers 140 are built with an oxide/nitride combination in the indent in the bipolar active region 110. The inside spacers 140 are possible owing to the topography created. Refer to FIG. 6A. Having formed the inside spacers 140, n++ poly-silicon (or mono-silicon) 145 is deposited onto the onto the SEG field 135A, 135B. With chemical mechanical polishing in one example process or an etch-back process, the excess poly-silicon is removed from the field 135B. Only in the dip of the bipolar active region 110 does the n++ poly-silicon 145 remain. This forms the n++ emitter of the HBT. Refer to FIG. 7A. Using a low temperature wet oxidation at about 700° C., a thin oxide layer 150 may be formed on the n++ emitter poly-silicon region 145. Any oxide formed on the Si/SiGe in the field is removed with a hydrofluoric acid (HF) dip. Refer to 8A. Using selective epitaxial growth (SEG) a boron-doped silicon layer 137 is deposited in the field region 135b, while the emitter 145 remains unaffected. In one example embodiment, the SEG extrinsic base may added to improve the extrinsic base resistance and to provide sufficient silicon for proper salicidation. (See FIG. 11A).

Figure 9A:
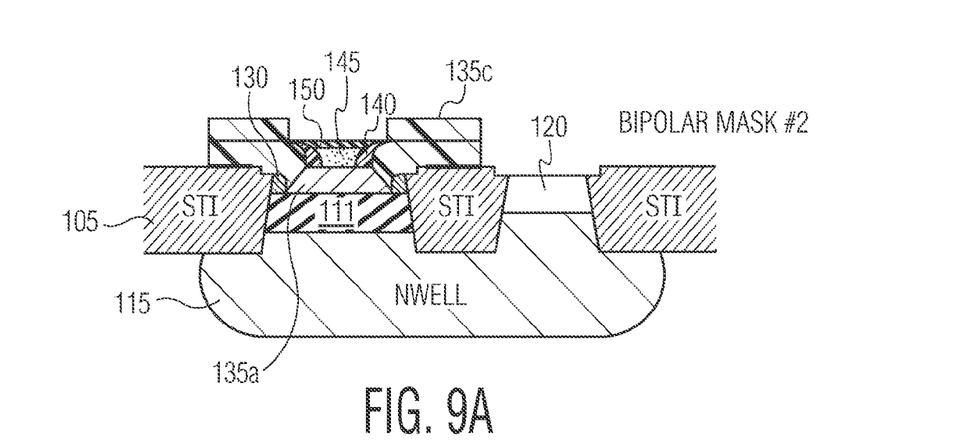
Figure 10A:
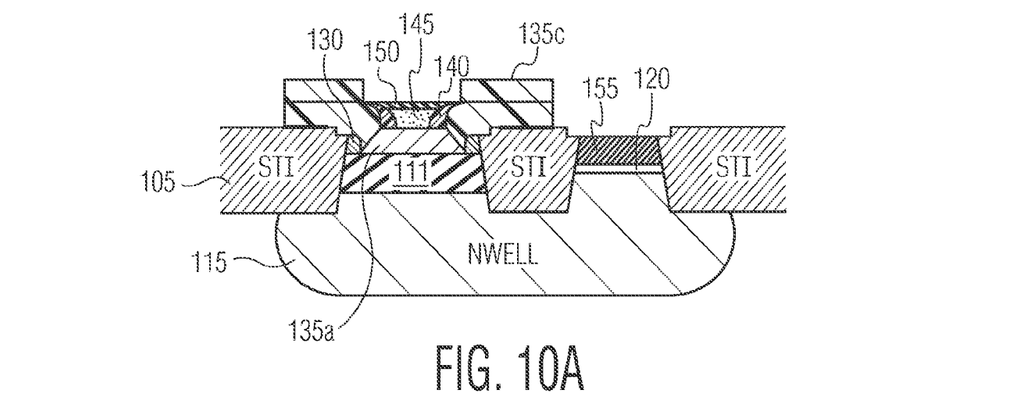
Figure 11A:
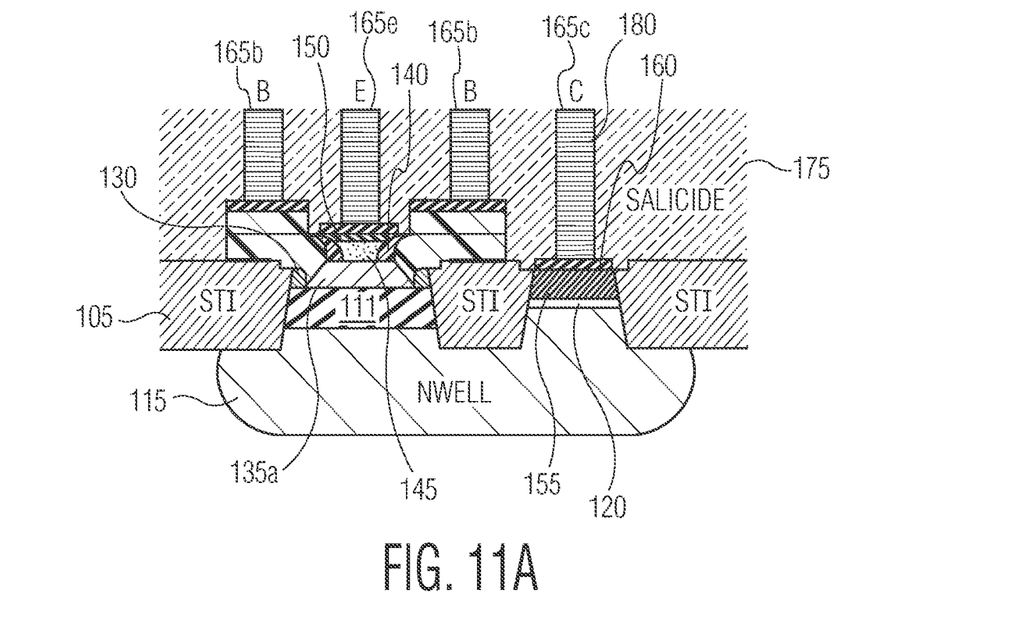

Refer to FIG. 9A. With the second additional bipolar mask, the extrinsic base 137 of the HBT is patterned. Any bipolar layers defined in the CMOS region are removed. After this second bipolar mask, the structure undergoes CMOS processing. Refer to FIG. 10A. The n++ S/D HDD is implanted 155. The n++ S/D HDD implantation 155 may also be used to lower the collector resistance of the HBT. Having defined the HBT, as shown in FIG. 11A, the HBT undergoes a salicidation step 160 and backend metallization 165. The inside spacers 140 used to separate the n++ emitter 145 from the extrinsic base 137, also serves to prevent bridging during salicidation 160. The CMOS spacers may remain along the edges of the raised extrinsic base 137. The transistor's emitter 165e, base 165b, and collector 165c are provided metallization 180 for electrical connection. A dielectric layer 175 protects the components of the HBT from contamination and damage. In an example process, the depth of the shallow trenches 105 in FIG. 11A is in the range of about 350-400 nm, the width of the emitter 165e is in the range of about 150-200 nm. The emitter width is about 150 nm, which includes contact size with overly (contact size+overlay=90+2*30=150 nm). The spacer is about 50 nm. A poly spacer of about 50 nm and epitaxial layer of about 100 nm means that the active area is about 450 nm based on 150+2*50+2*100=450 nm. However, each specific process incorporated the present invention may have particular ranges associated with it.

Figure 5B:
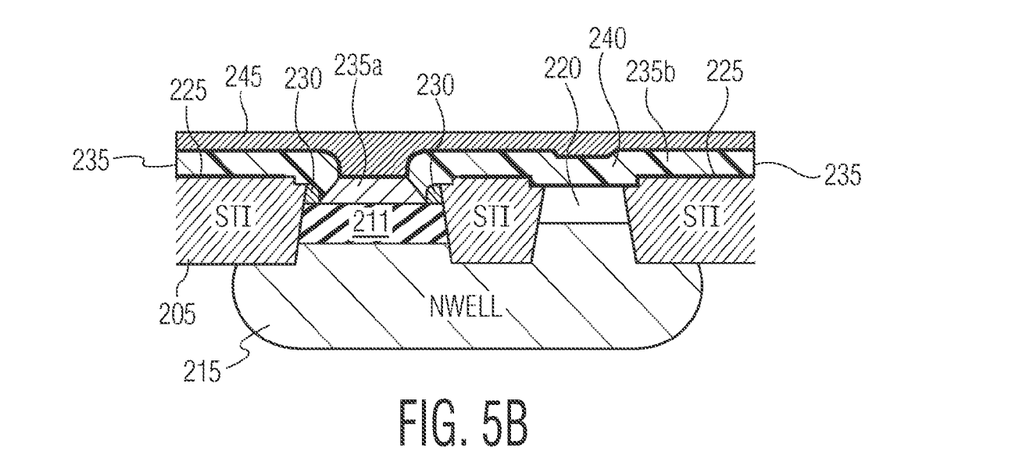
Figure 6A:
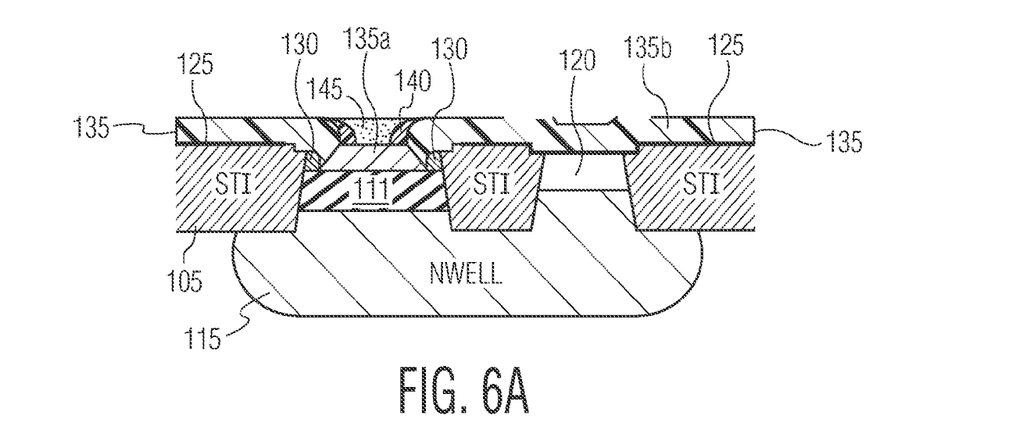
Figure 6B:
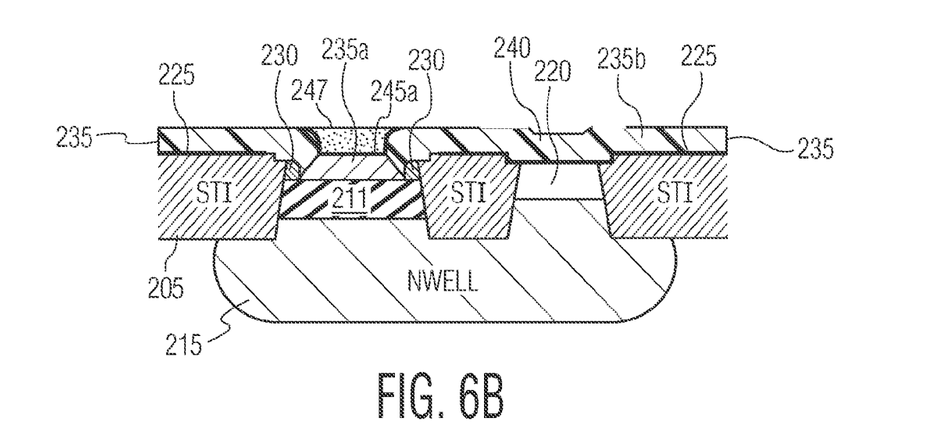

In another embodiment according to the present invention, a wafer substrate undergoes the same process (as shown in FIGS. 1-4) as that applied to the previous example. Subsequent steps are illustrated in FIGS. 5B-11B. Refer to FIG. 5B. After the epitaxial layer 235 has been deposited, a thin nitride layer 240 of about 50 nm is deposited on the epitaxial layer 135b. The protection layer 225 masks the CMOS region. A thick oxide layer 245 of range of 100 to about 200 nm or more particularly, about 150 nm is deposited on top of the thin nitride layer 240. Refer to FIG. 6B. The oxide layer 245 is planarized. The planarization may be with chemical mechanical polishing (CMP) or with an etch-back, stopping on the nitride layer 240. The nitride layer 240 is removed from the field 135b by a selective wet etch or a reactive ion etch (RIE). The indent 245a is covered with a nitride "U-cup" 247 filled in with an oxide 245.

Figure 7A:
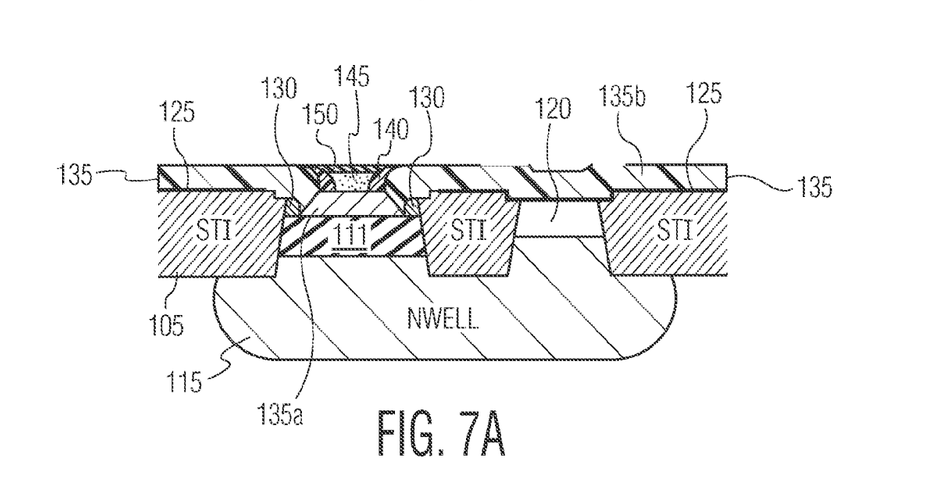
Figure 7B:
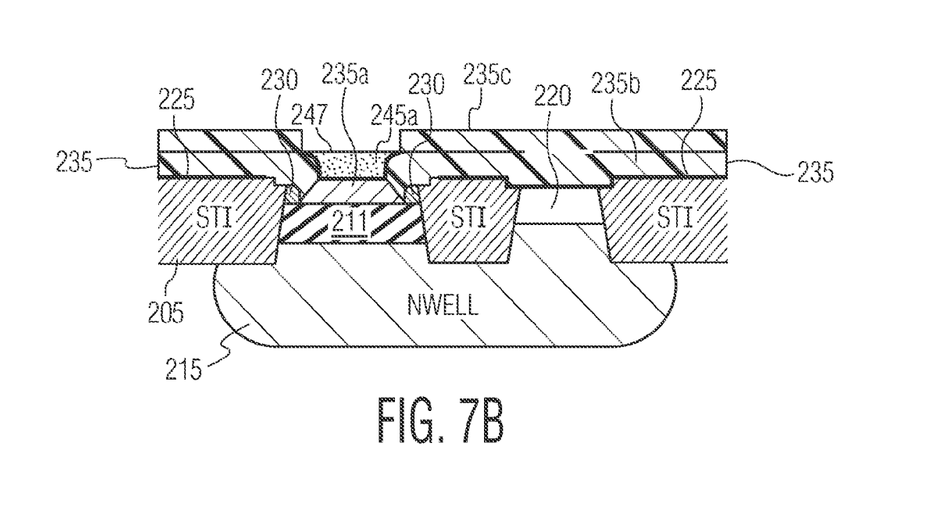

Refer to FIG. 7B. The extrinsic base 235c is thickened by using selective epitaxy (as was shown in FIG. 8A). For this embodiment, the raised extrinsic base is used to enhance the topography and to provide a sufficient process window during CMP or etch-back in later processing. After removal of the oxide fill, the nitride U-cup 247 may be used to serve as a masking layer while a thermal oxide is grown on the extrinsic base (field) area 235b. The U-cup masking further enhances the process window.

Figure 8A:
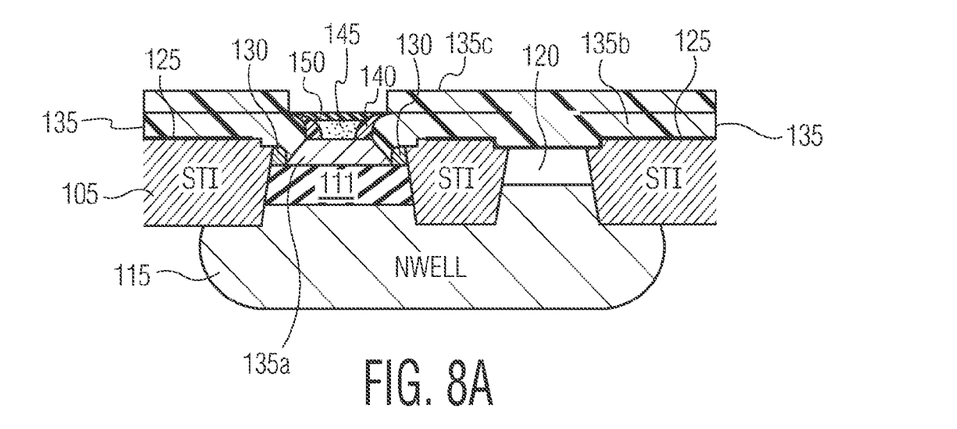
Figure 8B:
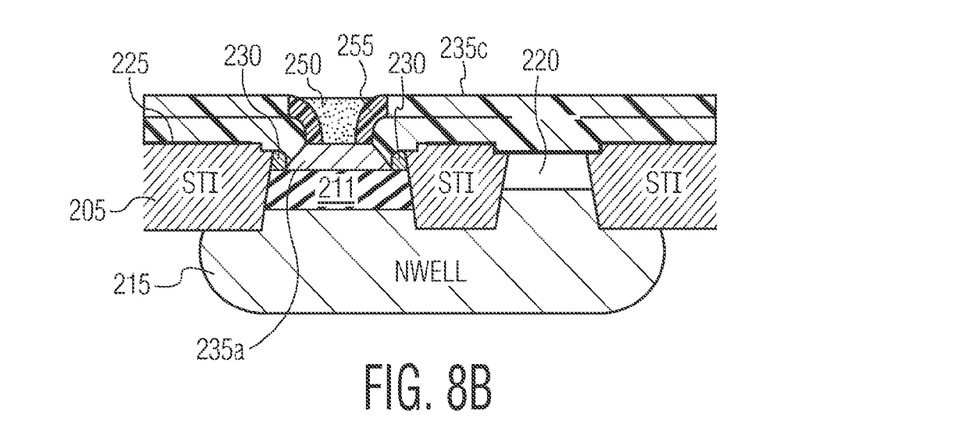

Refer to FIG. 8B. The oxide 245a and nitride fill 247 are removed from the indent. With appropriate processing, inside spacers 255 are formed. The emitter 250 is formed with n++ poly-silicon. Any poly-silicon deposited on the field 235b is removed by planarization, either CMP or etch-back. These steps are similar to those shown in FIG. 5A and FIG. 6A. However, the reversed order provides more silicon material (a raised extrinsic base) or an additional oxide layer that provides a CMP etch stop. The process window is increased.

Figure 9B:
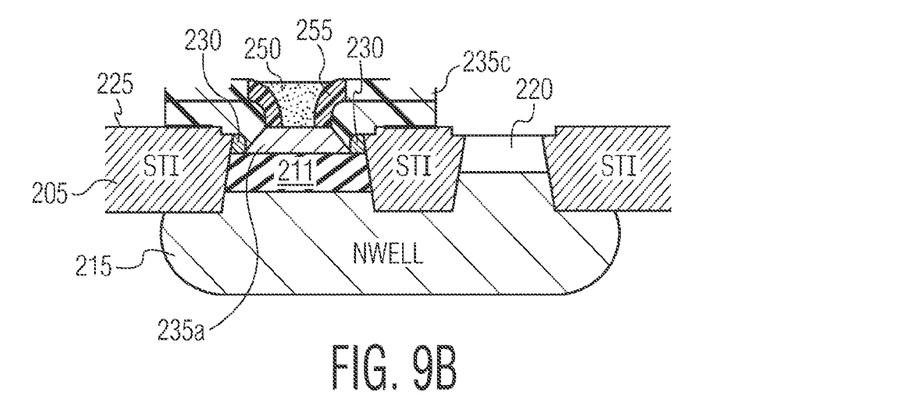
Figure 10B:
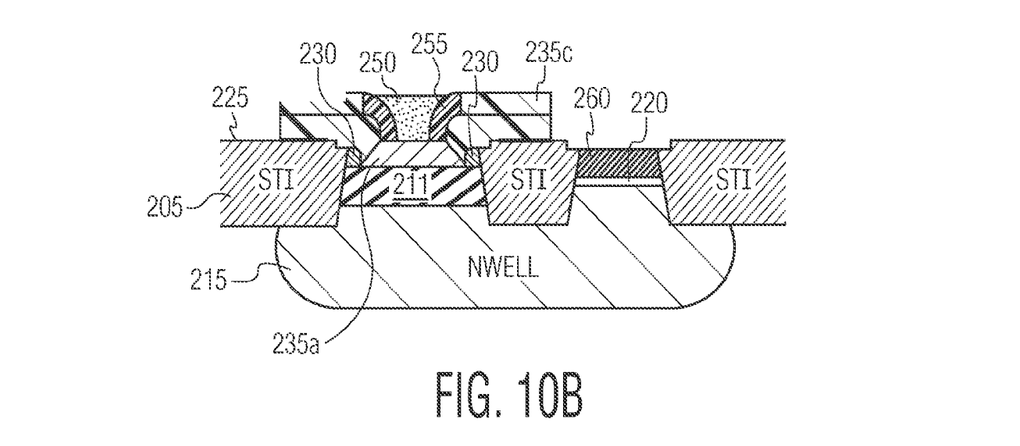
Figure 11B:
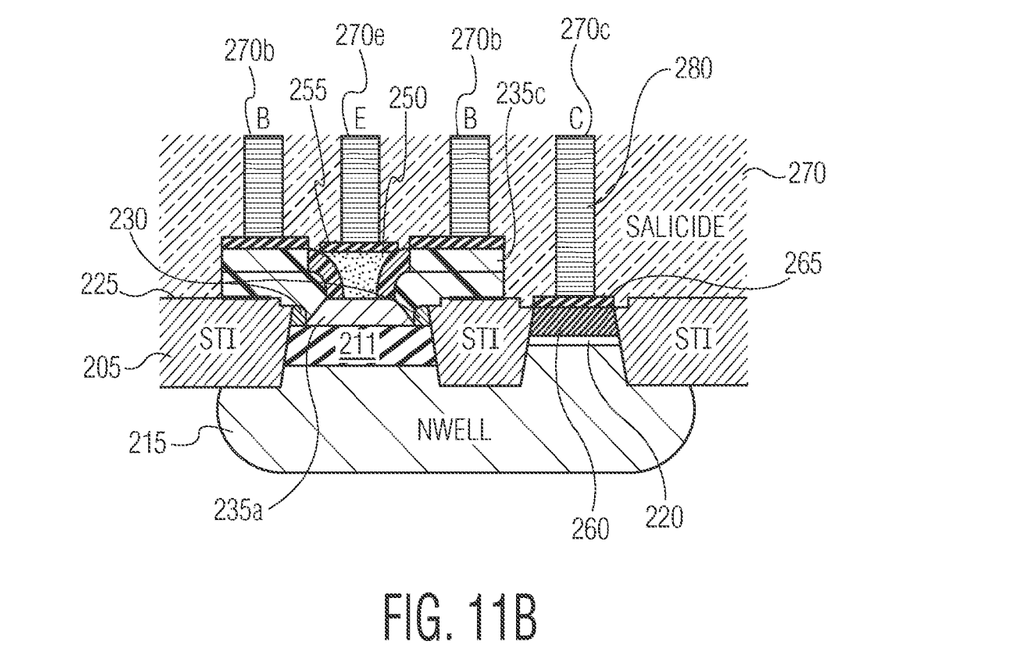

Refer to FIG. 9B. In a similar process as was depicted in the discussion of FIGS. 9A-11A, the extrinsic base 235c is patterned. Bipolar layers present in the CMOS regions are removed. Refer to FIG. 10B. The device now undergoes CMOS processing. There is an n++ S/D HDD implantation 260 in the CMOS active area 220. The implant species 260 is also included in the collector region in addition to areas defined in the CMOS (not illustrated). Refer to FIG. 11B. The n++ S/D HDD implantation 260 may also be used to lower the collector resistance of the HBT. Having defined the HBT, as shown in FIG. 11B, the HBT undergoes a salicidation step 265 and backend metallization 270. The inside spacers 255 used to separate the n++ emitter 250 from the extrinsic base 235c, also serves to prevent bridging during salicidation 265. The CMOS spacers may remain along the edges of the raised extrinsic base 235c. The transistor's emitter 270e, base 270b, and collector 270c are provided metallization 280 for electrical connection. A dielectric layer 270 protects the components of the HBT from contamination and damage.

Figure 12:
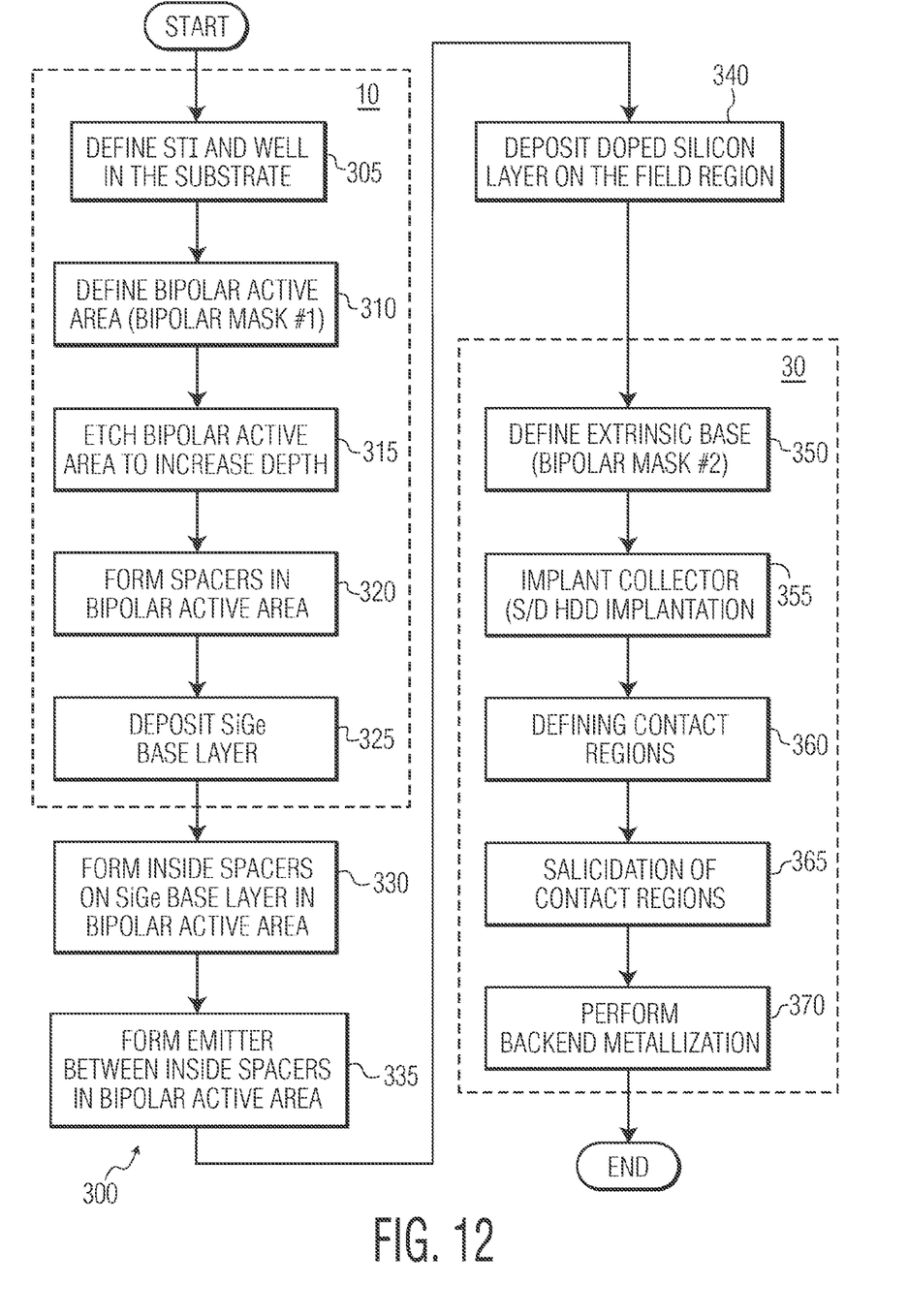
FIG. 12 is a flowchart of the example embodiment depicted in FIGS. 1-4 and FIG. 5A-11A.

The process of forming the self-aligned epitaxially grown bipolar transistor follows an example procedure as outlined in FIG. 12. The preliminary steps 10, in the example process, defines the shallow trench isolation (STI) and well regions in the substrate 305. Depending upon a specific technology, the well may either be an N-type or P-type. Thus, the resulting bipolar transistor may be fabricated as NPN or PNP. The bipolar active area is defined (bipolar mask #1 ) 310. To increase its depth, the bipolar active area is etched 315. Spacers are formed in the bipolar active area 320. The SiGe base layer is deposited 325. Within the bipolar active area, inside spacers are formed in the SiGe base layer 330. The emitter of the transistor is formed between the inside spacers in the bipolar active area 335. Polysilicon or (mono-silicon) doped n++ or p++ may be deposited on the field region 340. Only the emitter space of the bipolar transistor remains filled with this layer; any deposited silicon is removed from the field with CMP or other suitable process. A thin oxide is formed on the emitter (not illustrated). Any oxide grown on the SiGe field is removed with a suitable etch. In another series of steps 30, with a second mask (bipolar mask #2 ), the extrinsic base is defined 350. Any bipolar layers in the CMOS regions are removed. Within a CMOS process, the S/D HDD implantation 355 is used to lower the collector resistance of the bipolar transistor 355. Contact regions are defined 360. Contact regions 360 connecting the base, emitter, and collector of the bipolar transistor undergo salicidation 365. The metals used in the salicidation may include but are not limited to, titanium (Ti), cobalt (Co), and nickel (Ni). Having completed salicidation, a suitable dielectric is applied with appropriate openings defining the contact regions. Backend metallization is performed 370, providing electrical connection to the bipolar transistor and other devices on the substrate.

Figure 13:
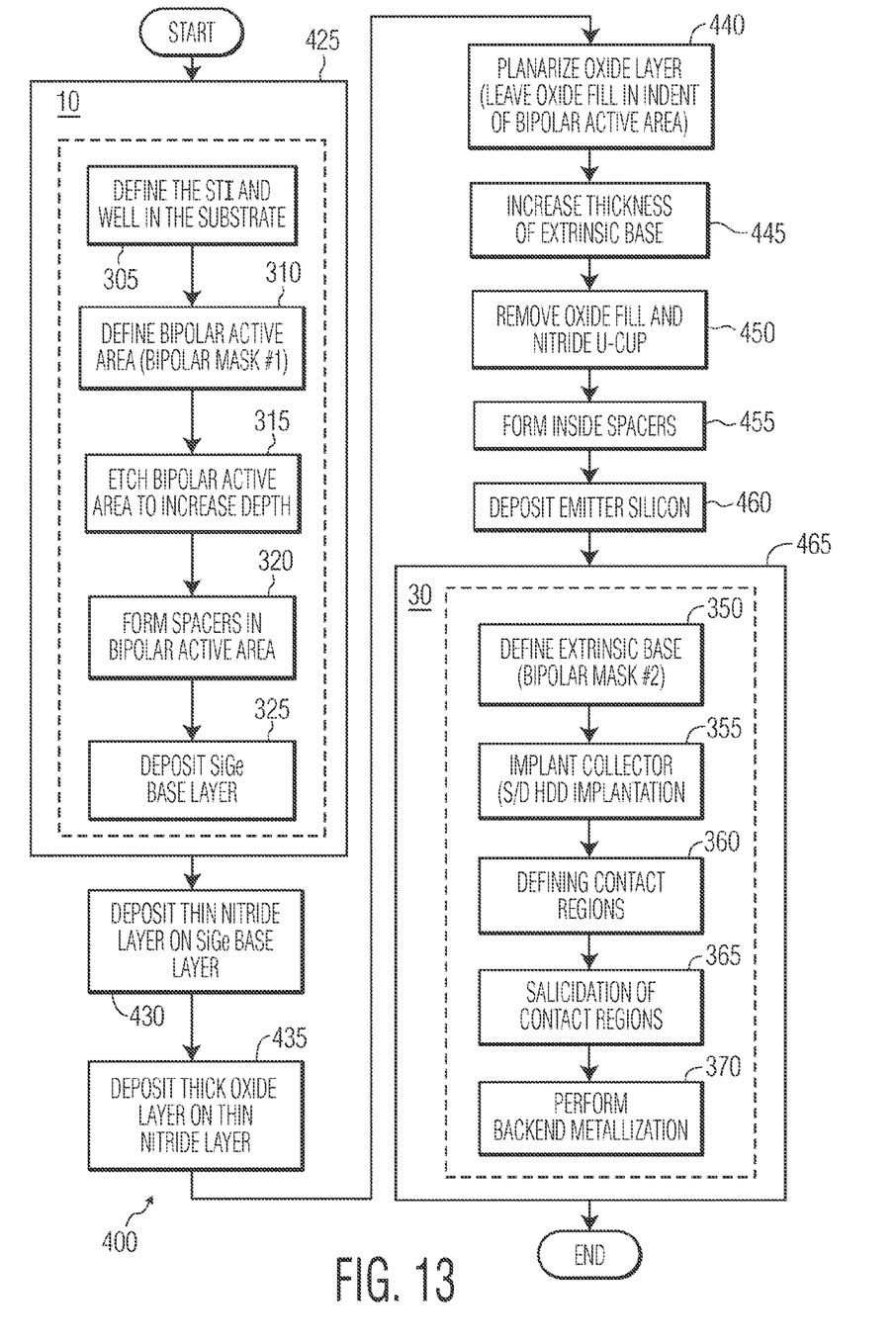
FIG. 13 is a flowchart of the example embodiment depicted in FIGS. 1-4 and FIG. 5B-11B.

In another example embodiment, (refer to FIG. 13) a process 400 begins with the series of steps 10 as discussed in reference to FIG. 12. A thin nitride layer is deposited on the SiGe base layer 430. Over the thin nitride layer, a thick oxide layer is deposited 435. The oxide layer is planarized, oxide fill remains in the indent of the bipolar active area 440. In some processes chemical mechanical polishing (CMP) is one possible method of achieving planarity. The thickness of the extrinsic base is increased 445 (above that done in 325 of the group of steps 10). The oxide fill and nitride U-cup is removed 450. Inside spacers 455 are formed in the bipolar active area 440 that ultimately is the emitter region of the HBT. Emitter silicon is deposited in the indent 460. The series of steps 30 completes the processing 465.

Numerous other embodiments of the invention will be apparent to persons skilled in the art without departing from the spirit and scope of the invention as defined in the appended claims.

What is claimed is:

1. A method for forming a self-aligned bipolar transistor over a silicon substrate having a well region of a first polarity type, the method comprising:
    defining a bipolar active region and field region in the bipolar region using a first bipolar mask, the active transistor area having an isolation region separating a bipolar region and a CMOS region, wherein defining the bipolar active area includes,
        etching the bipolar active region to a predetermined depth, and forming spacers in the bipolar active region after etching the bipolar active region to a predetermined depth;
    depositing a silicon-germanium-type (SiGe-type) base layer of a second polarity type into the bipolar active region and the field area, and
    forming inside spacers on the SiGe-type base layer within the bipolar active region;
    forming an emitter region between the inside spacers in the bipolar active region, wherein forming the emitter region includes,
        filling the emitter region with doped silicon of a first polarity type,
    defining an extrinsic base region using a second bipolar mask, removing material in the SiGe-type base layer as a function of masking protection provided by the second bipolar mask,
    implanting a collector region within the CMOS region; and defining at least one contact area for each of the extrinsic base region, the emitter region, and the collector region of the active transistor areas.

2. The method as recited in claim 1, wherein the polarity of the first type is opposite the polarity of the second type.

3. The method as recited in claim 2, wherein the polarity of the first type is N-type and the polarity of the second type is P-type.

4. The method as recited in claim 2, wherein the polarity of the first type is P-type and the polarity of the second type is N-type.

5. On a silicon substrate having a well region of a first polarity type, the well region apportioned into active transistor areas, the active transistor area having a bipolar region and a CMOS region, a method for forming a self-aligned bipolar transistor, the method comprising:
    defining a bipolar active region and field region in the bipolar region with a first bipolar mask, wherein defining the bipolar active area includes,
    etching the bipolar active region to a first predetermined depth,
    forming spacers in the bipolar active region,
    depositing a silicon-germanium (SiGe-type) base layer of a second polarity type into the bipolar active region and the field area, and
    forming a U-cup spacer on the SiGe-type base layer within the bipolar active region, wherein forming U-cup spacer includes,
    depositing a thin nitride layer on the SiGe-type base layer,
    depositing a thick oxide on top of the thin nitride layer,
    planarizing the thick oxide layer, stopping on the thin nitride layer,
    removing the nitride layer from the SiGe-type base layer, and
    increasing the depth of the bipolar active region to a second predetermined depth;
    forming an emitter region between the inside spacers in the bipolar active region, wherein defining the emitter region includes,
    filling the emitter region with doped silicon of a first polarity type,
    defining an extrinsic base region with a second bipolar mask, removing SiGe-type base layer from those areas not protected by the second bipolar mask,
    implanting a collector region within the CMOS region; and defining at least one contact area for the extrinsic base region, the emitter region, and the collector region of the active transistor areas.

6. The method as recited in claim 5, further comprising, forming spacers in the bipolar active region after etching the bipolar active region to a predetermined depth.

7. The method as recited in claim 5, wherein the polarity of the first type is opposite the polarity of the second type.

8. The method as recited in claim 6, wherein the polarity of the first type is N-type and the polarity of the second type is P-type.

9. The method as recited in claim 5, wherein the polarity of the first type is P-type and the polarity of the second type is N-type.

* * * * *